US010670204B1

(12) United States Patent
Li

(10) Patent No.: US 10,670,204 B1
(45) Date of Patent: Jun. 2, 2020

(54) LED LIGHT STRIP

(71) Applicant: GUANGDONG OML TECHNOLOGY CO., LTD, Zhongshan, Guangdong (CN)

(72) Inventor: Xiaoping Li, Guangdong (CN)

(73) Assignee: GUANGDONG OML TECHNOLOGY CO., LTD., Zhongshan (CN)

( * ) Notice: Subject to any disclaimer, the term of this patent is extended or adjusted under 35 U.S.C. 154(b) by 0 days.

(21) Appl. No.: 16/257,099

(22) Filed: Jan. 25, 2019

(51) Int. Cl.
*F21S 4/28* (2016.01)
*F21V 15/01* (2006.01)
*H01L 33/58* (2010.01)
*H01L 33/62* (2010.01)
*F21Y 115/10* (2016.01)

(52) U.S. Cl.
CPC ............... *F21S 4/28* (2016.01); *F21V 15/01* (2013.01); *H01L 33/58* (2013.01); *H01L 33/62* (2013.01); *F21Y 2115/10* (2016.08)

(58) Field of Classification Search
None
See application file for complete search history.

(56) References Cited

U.S. PATENT DOCUMENTS

| | | | | |
|---|---|---|---|---|
| 2004/0183449 | A1* | 9/2004 | Monk | B60Q 1/2611 315/77 |
| 2010/0008090 | A1* | 1/2010 | Li | F21V 17/007 362/249.03 |
| 2013/0293098 | A1* | 11/2013 | Li | F21V 3/02 313/512 |
| 2013/0307416 | A1* | 11/2013 | Xu | H05B 37/02 315/122 |
| 2017/0045187 | A1* | 2/2017 | Li | B29C 48/17 |
| 2018/0206300 | A1* | 7/2018 | Farnsworth | F21S 4/28 |
| 2019/0093870 | A1* | 3/2019 | Liu | F21V 25/00 |
| 2019/0097108 | A1* | 3/2019 | Ruan | H01L 33/641 |
| 2019/0115515 | A1* | 4/2019 | Altannura | F21V 21/002 |

FOREIGN PATENT DOCUMENTS

CN 201273489 Y * 7/2009
CN 206669424 U 11/2017

* cited by examiner

*Primary Examiner* — Britt D Hanley

(57) ABSTRACT

The present invention provides a LED light strip, wherein the light strip comprises an outer casing, an inner casing disposed in the outer casing and a light-emitting component placed in the inner casing, the light-emitting component comprises a substrate and some LED illuminant modules set on the substrate, the inner casing is provided with a light exit through which the light of the LED illuminant directly passes, cut marks are arranged in a position between the light exits corresponding to a interval of LED illuminant modules connected in parallel, and a wall of the outer casing facing the LED illuminant is transparent. The cut mark of the present invention is easily seen and a user can see the cut mark trough the transparent wall directly thus facilitating the cutting.

8 Claims, 3 Drawing Sheets

LED LIGHT STRIP

FIELD OF THE INVENTION

The present invention relates to the field of lighting technology, particularly to a LED light strip.

BACKGROUND OF THE INVENTION

Because of its characteristics of soft, light, pure color and easy installation, LED light strips are widely used in decoration of building contours, steps, booths, bridges, hotels, KTV decorative lighting, advertising signs, and in advertising designs for animations, scripts, paintings, and so on. When using a flexible light strip, it is often necessary to adjust the length of the strip by cutting it to meet different requirements in various occasions, but the cutting may easily destroy the LED inside the light strip and affects the use. To facilitate the cutting, the light strip is usually accompanied with a cut mark, the cut mark is generally disposed on a side facing away from the light source, and the cut mark can be seen through a light-transmitting layer of the light strip for cutting.

Since the use of LED light strips is more and more widespread, there is a need for different shapes and colors of the strips. Currently, a cut mark is hardly seen through a light-transmitting layer in the condition that the light strip is not transparent, making it difficult for appropriate cutting of the light strip.

Chinese patent CN206669424U discloses a flexible LED light strip with a cut mark and easy for cutting, wherein the cut mark is set on a side of the circuit board of the main body of the LED light strip facing away from an LED light source, and the cut mark is further provided with light-transmitting holes, so that the light emitted by the LED light source on one side of the light strip passes through the light-transmitting holes to the other side of the light strip, or the light of an external light source on the LED light side passes through the light-transmitting holes to the other side of the light strip, thus a user can accurately locate the cutting site, preventing damages to the light strip by mis-operation and improving the cutting quality.

In the above-mentioned patent, the cut mark is set on the circuit board of the light strip, so the cut mark can only be seen when the light lights up or there is an external light source, which is inconvenient to use. In addition, the main body of the light strip needs to be provided with a light-transmitting layer for observation, which not only increases the production cost, but also causes light leak from the light-transmitting layer, thus reducing the luminous efficiency of the light strip.

SUMMARY OF THE INVENTION

A technical problem to be solved by the present invention is to provide a LED light strip which is simple in structure, convenient for cutting, handy and practical.

A technical problem to be solved by the present invention is to provide a LED light strip with uniform illumination and pleasing overall appearance.

A technical problem to be solved by the present invention is to provide a LED light strip which is convenient to install and produced in automation.

To solve the above-mentioned technical problems, the present invention provides an LED light strip which comprises an outer casing, an inner casing installed in the outer casing, and a light-emitting component disposed in the inner casing. The light-emitting component includes a substrate and some LED illuminant modules set on the substrate, each LED illuminant module is connected in parallel with each other, each LED illuminant module comprises some LED illuminants connected in serial and a voltage-regulator diode, and the LED illuminant and the voltage-regulator diode is connected in serial, the inner casing is provided with a light exit through which the light from the LED illuminant can directly go out, a cut mark is provided between the light exits corresponding to intervals of the LED illuminant modules connected in parallel, and a wall of the outer casing facing the LED illuminant is transparent.

Preferably, the inner casing is provided with a cavity and a slot, the slot is located at the bottom of the inner casing and connected with the cavity, the cavity is connected to the light exit, and the light-emitting component is disposed in the cavity.

More preferably, the upper surface of the transparent wall has many curved protrusions, and there are many small holes on the side of the transparent wall that towards the LED illuminant.

More preferably, the diameter of each curved protrusion is D, the distance between peaks of two adjacent curved protrusions is R, the diameter of the small hole is d, and the distance between adjacent small holes is r, the distance between the LED illuminant and the curved protrusion is L, wherein $$\arctan(R-r)/L = \arccos(D-d)/L.$$

More preferably, the light-emitting component further comprises two conductive strips, and the conductive strips are disposed on the substrate lying on both sides of the LED illuminant module, connecting every LED illuminant module in parallel.

More preferably, the conductive strip is a copper wire or a copper plate, the conductive strip is fixed to the substrate by welding.

More preferably, the inner casing is provided with two wire slots, a wire electrically connected to the substrate is disposed in the wire slot, and the wire forms a parallel connection of each LED illuminant module.

More preferably, the transparent wall is melt-extruded by a composition of at least two kinds of resins comprising a light diffusion layer of a ridge structure, the light diffusion layer has a thickness of 200 μm to 400 μm.

More preferably, the refractivity difference of at least two resins is from 0.01 to 0.06, wherein at least two resins are incompatible, wherein at least one of the resins is a polyolefin-based resin.

More preferably, lateral walls of the outer casing are opaque made of an opaque material.

The present invention has the following beneficial effects:

1. The LED light strip of the present invention has a simple structure. A user can see the cut mark on the inner casing through the transparent wall directly, when setup, the user only needs to cut the light strip according to the cutting mark to use, since the cut mark is correspondingly arranged between the LED illuminant modules connected in parallel, the circuit will not be affected, and thus the illumination guaranteed.

2. The transparent wall of the present invention adopts the principle of a compound eye. Each curved protrusion serves as a microlens, and multiple curved protrusions as a microlens array for luminous radiation. In addition, there are some small holes on a side of the transparent wall that facing the LED illuminant, and each small hole acts as a small eye of a compound eye being independent of each other, so that the light passing through the different small holes does not interfere with each other. The transparent wall of the present invention radiates the light emitted by the LED illuminant, which thereby greatly improves the luminous efficiency and uniformity of the light strip, makes the color of the light emitted by the light strip more uniform when projected onto the object and avoids discoloration or spotting of the light, thus providing a more pleasing overall appearance of the light strip.

3. The LED light strip provided by the present invention, wherein the conductive strip is disposed on the substrate to form a parallel connection of each LED illuminant module, an external power is electrically connected with the substrate, and the conductive strip and the substrate are integrated structures which can be installed by equipment automatically making the installation labor-saving and more efficient.

DETAILED DESCRIPTION OF ILLUSTRATED EMBODIMENTS

To better illustrate the present invention in aspects of the objective, technical scheme and advantages, the present invention is further described in detail with reference to the accompanying drawings.

Figure 1:
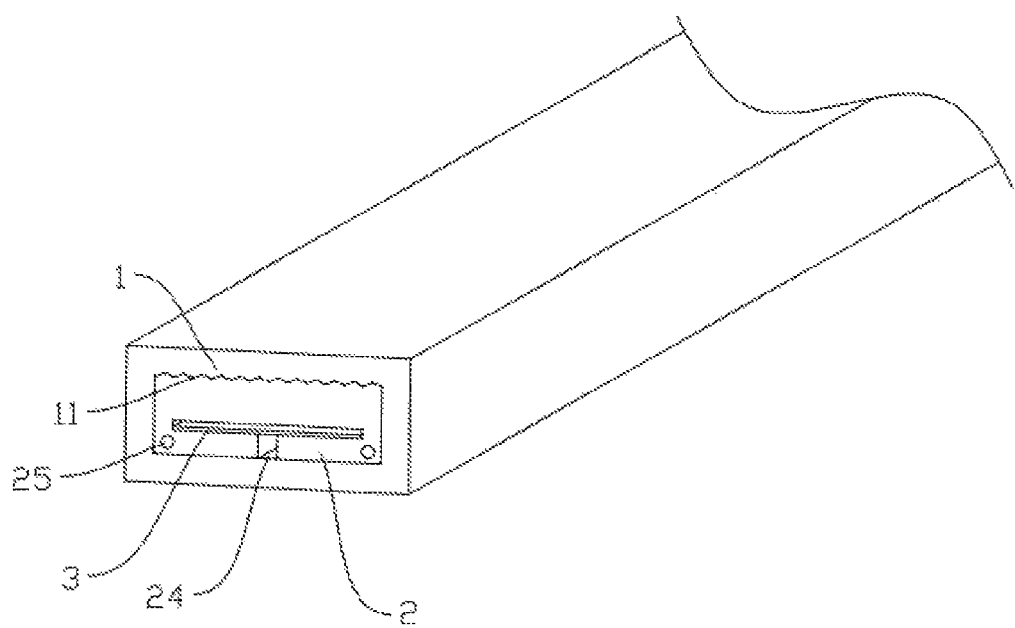
FIG. 1 shows a structural schematic of an LED light strip of the present invention.
Figure 2:
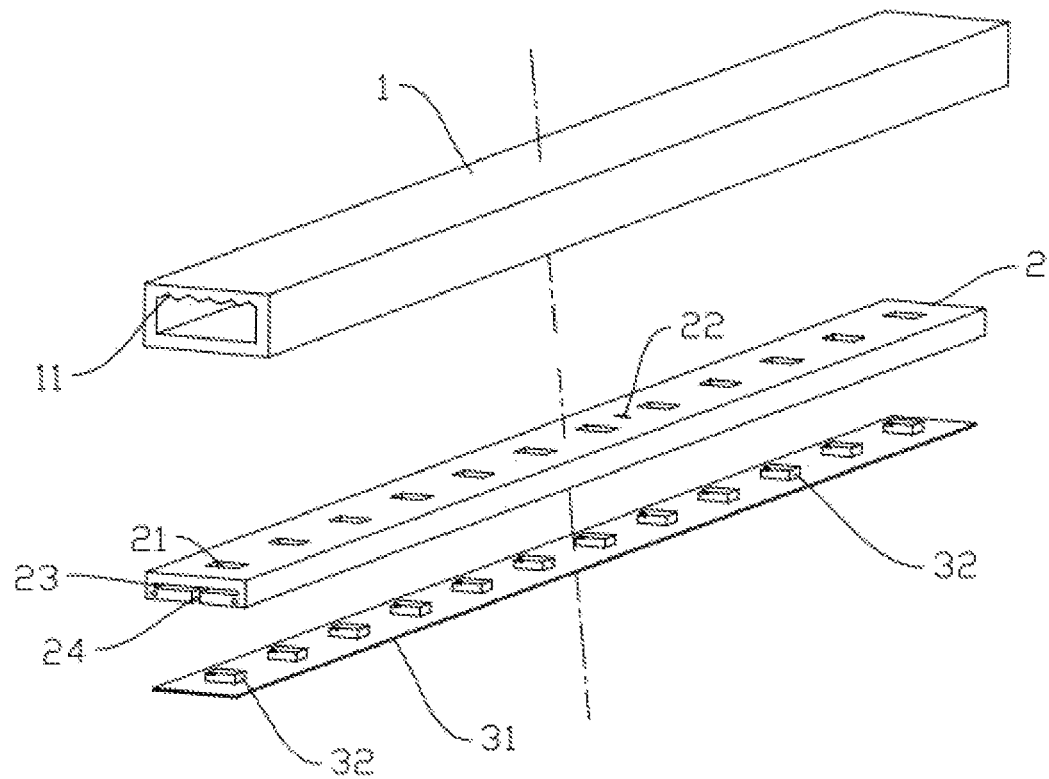
FIG. 2 shows a stereoscopic exploded view of an LED light strip of the present invention.
Figure 3:
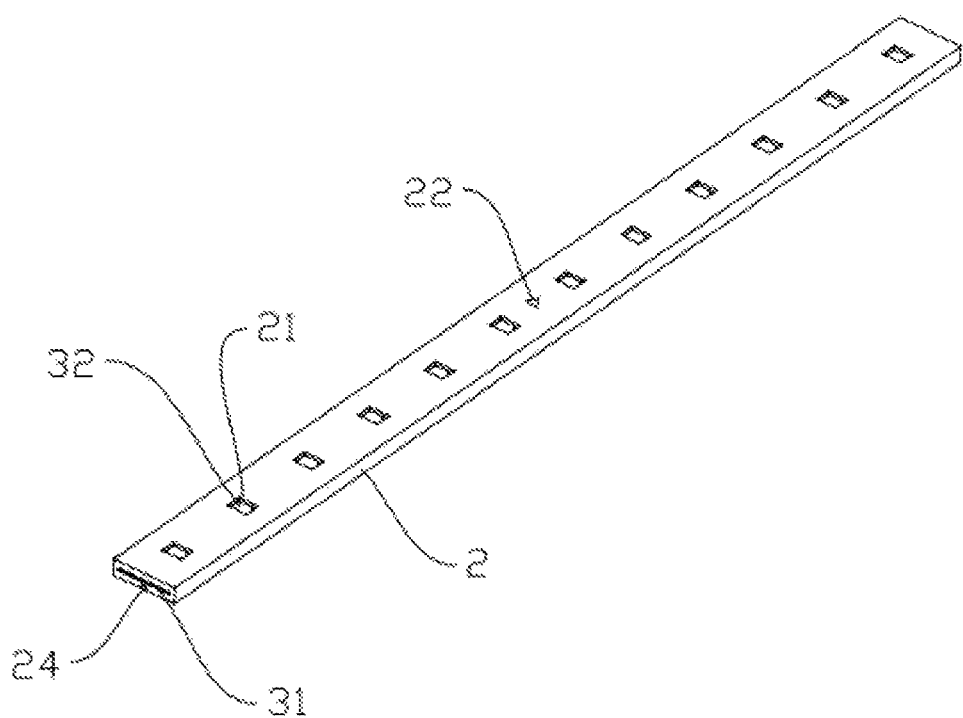
FIG. 3 shows a structural schematic of a light-emitting component installed in an inner casing of the present invention.

Referring to FIG. 1 to FIG. 3, the present invention provided an LED light strip which comprised an outer casing 1, an inner casing 2 installed in the outer casing 1, and a light-emitting component 3 disposed in the inner casing 2. The light-emitting component 3 included a substrate 31 and some LED illuminant modules fixed on the substrate 31, each LED illuminant module was connected in parallel with each other, each LED illuminant module included some LED illuminants 32 connected in serial and a voltage-regulator diode, and the LED illuminant and the voltage-regulator diode was connected in serial. The inner casing 2 was provided with a light exit 21 through which the light from the LED illuminant 32 could directly go out, the light exit 21 was provided with a cut mark 22 laying between the LED illuminant modules connected in parallel, and a wall of the outer casing 1 that facing the LED illuminant 32 was of light transmission.

Specifically, the inner casing 2 was provided with a cavity 23 and a slot 24, the slot 24 was located at the bottom of the inner casing 2 and connected with the cavity 23, the cavity 23 was attached to the light exit 21, and the light-emitting component 3 was disposed in the cavity 23. The present invention expanded the volume of the cavity 23 by the use of the slot 24, thereby facilitating the placement of the substrate 31 into the cavity 23 and the insertion of the LED illuminant 32 in the light exit 21. According to the prior art, the inner casing of the light strip has at least one transparent wall, and since the LED illuminant is disposed in the inner casing, the light emitted from the LED illuminant needs to go through the inner casing. However, in the present invention the light from the LED illuminant emitted out of the outer casing directly through the light exit without passing through the inner casing, therefore, the inner casing of the present invention could be designed in a variety of colors. What's more, the opaque inner casing could also shield the substrate, that makes the light strip more pleasing to the eye and broaden its application.

Further, the inner casing 2 was provided with two wire slots 25, and the wire slots 25 were provided with wires electrically connected to the substrate 31, and the wires formed a parallel connection for each LED illuminant module. The wire slots 25 were located below the cavity 23 and symmetrically disposed. Moreover, the wires were used to form an electrical connection between the external power and the substrate 31.

Specifically, the substrate 31 was a flexible circuit board, the substrate 31 was provided with some LED illuminant 32, and the LED illuminant 32 were convex on the substrate 31 and arranged in a row. The inner casing 2 was encapsulated by the injection molding wrapping the substrate 31 inside, and the LED illuminant 32 protruded from the light exit 21 or in the light exit 21, and the light from the LED illuminant 32 directly emitted through the light-transmitting layer of the outer casing 1 without passing through the inner casing 2, thereby improving the luminous efficiency of the light strip. The cut mark 22 was formed while the inner casing 2 was injection molded, or made after the inner casing 2 was formed, the cut mark 22 could be disposed on the surface of the inner casing 2 or throughout the inner casing 2. Further, the shape of the cut mark 22 could be a circle, a triangle, an ellipse, a star, a polygon, a line, and so on.

The LED light strip of the present invention had a simple structure, when setup, the user only needs to cut according to the cutting mark for use, since the cut mark was correspondingly arranged between the LED illuminant modules in parallel, the circuit will not be affected by the cutting, and thus the illumination guaranteed. In addition, the LED illuminant module of the present invention was equipped with a voltage-regulator diode for stabilizing the voltage of the LED illuminant module and ensuring that the light strip do work after being cut.

Since the light emitted by the LED illuminant 32 needs to pass through the transparent wall, in order to improve the light uniformity of the LED light strip, the transparent wall was melt-extruded by a composition of at least two kinds of resins comprising a light diffusion layer of a ridge structure, the light diffusion layer had a thickness of 200 μm to 400 μm.

Preferably, the refractivity difference of at least two resins was from 0.01 to 0.06.

Preferably, at least two resins were incompatible, and at least one of the resins was a polyolefin-based resin, wherein the polyolefin-based resin was a polyethylene-based resin, a polypropylene-based resin, or a cyclic polyolefin-based resin.

Preferably, at least two resins were incompatible, wherein two of the resins were polyolefin-based resins, and the polyolefin-based resin was a polyethylene-based resin, a polypropylene-based resin, or a cyclic polyolefin-based resin.

In order to increase the transmittance of the transparent wall of the outer casing 1, concentrate the light on the transparent wall for delivery, and prevent light leakage from lateral walls of the light strip, lateral walls of the outer casing 1 were opaque made of an opaque material.

Figure 4:
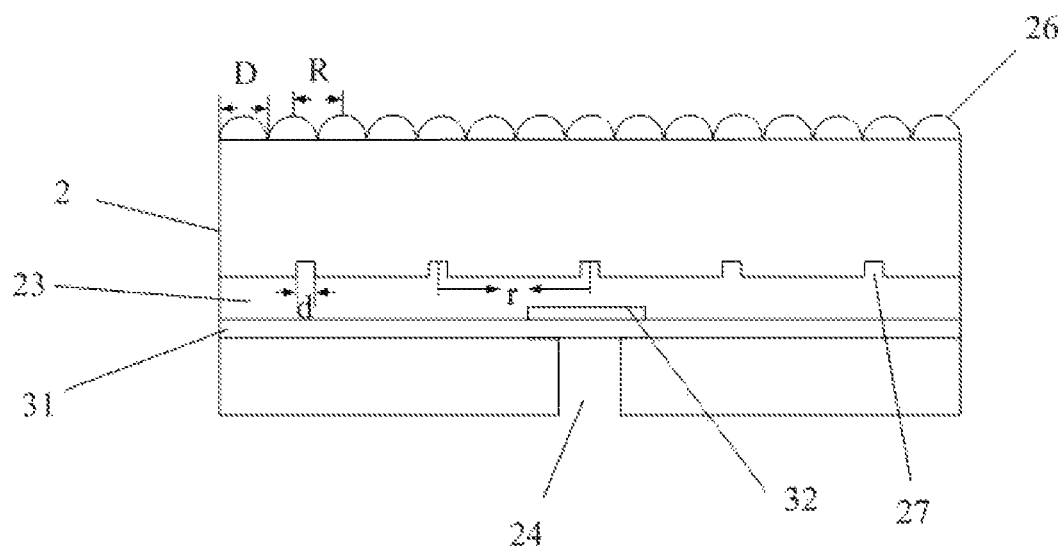
FIG. 4 shows a schematic of an inner casing and a light-emitting component according to an embodiment of the present invention.

In another preferable embodiment of the present invention, as shown in FIG. 4, the upper surface of the transparent wall of the present invention had many curved protrusions 26, and there were many small holes 27 on the side towards the LED illuminant 32. Specifically, the diameter of each curved protrusion 26 was D, the distance between peaks of two adjacent curved protrusions 26 was R, the diameter of the small hole 27 was d, and the distance between adjacent small holes 12 was r, the distance between the LED illuminant 32 and the curved protrusion 26 was L, wherein arctan(R−r)/L=arccos (D−d)/L. The transparent wall of the preferable embodiment adopted the principle of a compound eye. Each curved protrusion served as a microlens, and some curved protrusions as a microlens array for luminous radiation. In addition, some small holes were provided on the side of the transparent wall facing the LED illuminant 32, each small hole acted as a small eye of a compound eye which is independent of each other, so that the light passing through the different small holes did not interfere with each other. The transparent wall of the present invention radiated the light emitted by the LED illuminant 32, which thereby greatly improved the luminous efficiency and uniformity of the light strip, made the color of the light emitted by the light strip more uniform when projected onto the object and avoided discoloration or spotting of the light, thus providing a more pleasing overall appearance of the light strip.

Figure 5:
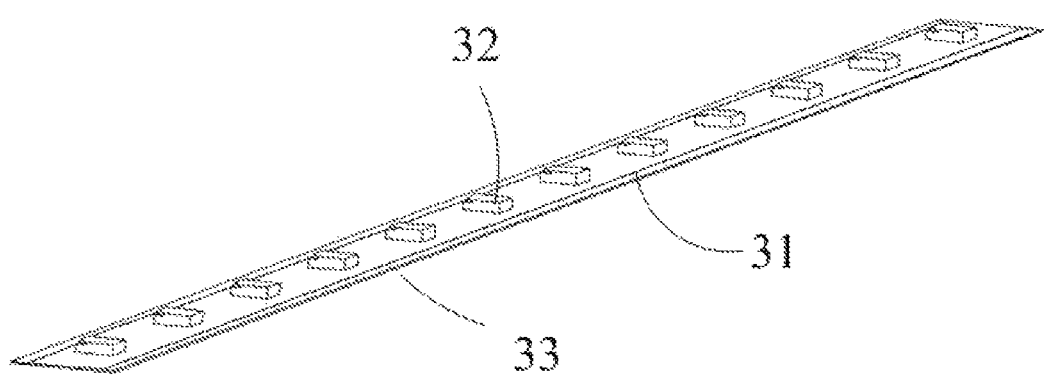
FIG. 5 shows a structural schematic of a light-emitting component according to an embodiment of the present invention.

In another preferable embodiment of the present invention, as shown in FIG. 5, the light-emitting component 3 further included two conductive strips 33 disposed on the substrate 31 laying on both sides of the LED illuminant module, connecting every LED illuminant module in parallel. The conductive strip 33 was a copper wire or a copper plate, but not limited thereto. In the present invention, the conductive strip 33 could also be made of other conductive metals. The conductive strip 33 was fixed to the substrate 31 by welding, together with the substrate 31 as an integral structure. When setup, it is only necessary to mount the substrate 31 in the inner casing 2, while the previous method requires manual insertion of the copper wire into the inner casing 2 to form an electrically conductive connection with the substrate 31 which is inefficient in production. Further, the conductive strips 33 was used to form an electrical connection between the external power and the substrate 31.

The above disclosures are only preferable embodiments of the present invention, the protection of the present invention is not limited thereto, and thus equivalent amendments made in the claims of the present invention are still within the protection of the present invention.

What is claimed is:

1. An LED light strip, wherein the LED light strip comprises an outer casing, an inner casing installed in the outer casing, and a light-emitting component disposed in the inner casing, the light-emitting component comprises a substrate and an LED illuminant module set on the substrate, the inner casing is provided with a light exit through which the light from the LED illuminant can directly go out, a cut mark is provided on a site between the light exits corresponding to an interval of the LED illuminant modules which are connected in parallel, and a wall facing the LED illuminant of the outer casing is a transparent wall;

an upper surface of the transparent wall has a curved protrusion, and there is a small hole on a side of the transparent wall facing the LED illuminant;

a diameter of a curved protrusion is D, a distance between peaks of two adjacent curved protrusions is R, a diameter of the small hole is d, and a distance between adjacent small holes is r, a distance between the LED illuminant and the curved protrusion is L, wherein $\arctan(R-r)/L = \arccos(D-d)/L$.

2. The LED light strip according to claim 1, wherein the inner casing is provided with a cavity and a slot, the slot is located at a bottom of the inner casing and connected with the cavity, the cavity is connected to the light exit, and the light-emitting component is disposed in the cavity.

3. The LED light strip according to claim 1, wherein the light-emitting component further comprises two conductive strips, and the conductive strips are disposed on the substrate and located on both sides of the LED illuminant module connecting each of the LED illuminant modules in parallel.

4. The LED light strip according to claim 3, wherein the conductive strip is a copper wire or a copper plate, the conductive strip is fixed to the substrate by welding.

5. The LED light strip according to claim 1, wherein the inner casing is provided with two wire slots, a wire electrically connected to the substrate is disposed in the wire slot, and the wire forms a parallel connection of each LED illuminant module.

6. The LED light strip according to claim 1, wherein the transparent wall is melt-extruded by a composition of at least two kinds of resins comprising a light diffusion layer of a ridge structure, the light diffusion layer has a thickness of 200 μm to 400 μm.

7. The LED light strip according to claim 6, wherein the refractivity difference of the at least two resins is from 0.01 to 0.06, wherein the at least two resins are incompatible, wherein at least one of the resins is a polyolefin-based resin.

8. The LED light strip according to claim 1, wherein lateral walls of the outer casing are opaque made of an opaque material.

* * * * *